(12) United States Patent
Nakahara et al.

(10) Patent No.: US 10,355,454 B2
(45) Date of Patent: Jul. 16, 2019

(54) OPTICAL SEMICONDUCTOR DEVICE, OPTICAL MODULE, AND METHOD FOR MANUFACTURING OPTICAL SEMICONDUCTOR DEVICE

(71) Applicant: Oclaro Japan, Inc., Sagamihara, Kanagawa (JP)

(72) Inventors: Kouji Nakahara, Tokyo (JP); Takeshi Kitatani, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/696,509

(22) Filed: Sep. 6, 2017

(65) Prior Publication Data

US 2018/0090910 A1     Mar. 29, 2018

(30) Foreign Application Priority Data

Sep. 26, 2016 (JP) .................................. 2016-187517

(51) Int. Cl.
*H01S 5/12* (2006.01)
*H01S 5/227* (2006.01)
(Continued)

(52) U.S. Cl.
CPC ............... *H01S 5/227* (2013.01); *G02B 6/42* (2013.01); *H01S 5/2275* (2013.01); *H01S 5/24* (2013.01); *H01S 5/343* (2013.01); *H01S 5/34306* (2013.01); *H01S 5/0287* (2013.01); *H01S 5/02284* (2013.01); *H01S 5/02288* (2013.01); *H01S 5/12* (2013.01); *H01S 5/2009* (2013.01);
(Continued)

(58) Field of Classification Search
CPC ........ H01S 5/2275; H01S 5/2277; H01S 5/12; H01S 5/222; H01S 5/2009
See application file for complete search history.

(56) References Cited

U.S. PATENT DOCUMENTS

2007/0104242 A1* 5/2007 Kudo ..................... B82Y 20/00
                                                                    372/96
2010/0288997 A1* 11/2010 Fukamachi ............ B82Y 20/00
                                                                    257/13
(Continued)

FOREIGN PATENT DOCUMENTS

JP       2013-165133 A     8/2013
JP       2014-150145 A     8/2014

*Primary Examiner* — Michael Carter
(74) *Attorney, Agent, or Firm* — Mattingly & Malur, PC

(57) ABSTRACT

Provided is an optical semiconductor device which has long-term reliability since a threshold current is small, and a relaxation oscillation frequency is high. An optical semiconductor device includes an InP semiconductor substrate, a lower mesa structure that is disposed above the InP semiconductor substrate, and includes a multiple quantum well layer, an upper mesa structure that is disposed on the lower mesa structure, and includes a cladding layer, a buried semiconductor layer that buries both side surfaces of the lower mesa structure, and an insulating film that covers both side surfaces of the upper mesa structure by being in contact with both side surfaces of the upper mesa structure, in which the lower mesa structure includes a first semiconductor layer, above the multiple quantum well layer, and the upper mesa structure includes a second semiconductor layer which is different from the cladding layer in composition, below the cladding layer.

9 Claims, 13 Drawing Sheets

(51) Int. Cl.
  *H01S 5/24*    (2006.01)
  *H01S 5/343*   (2006.01)
  *G02B 6/42*    (2006.01)
  H01S 5/022     (2006.01)
  H01S 5/028     (2006.01)
  H01S 5/20      (2006.01)
  H01S 5/22      (2006.01)
  H01S 5/32      (2006.01)

(52) U.S. Cl.
  CPC ............. *H01S 5/222* (2013.01); *H01S 5/2214* (2013.01); *H01S 5/2224* (2013.01); *H01S 5/2226* (2013.01); *H01S 5/3213* (2013.01); *H01S 2301/166* (2013.01)

(56) References Cited

U.S. PATENT DOCUMENTS

2013/0208751 A1* 8/2013 Nakahara .............. H01S 5/3403
                                                    372/45.011
2014/0211823 A1   7/2014 Nakahara et al.

* cited by examiner

OPTICAL SEMICONDUCTOR DEVICE, OPTICAL MODULE, AND METHOD FOR MANUFACTURING OPTICAL SEMICONDUCTOR DEVICE

CROSS-REFERENCE TO RELATED APPLICATION

The present application claims priority from Japanese application JP 2016-187517, filed on Sep. 26, 2016, the content of which is hereby incorporated by reference into this application.

BACKGROUND OF THE INVENTION

1. Field of the Invention

The present invention relates to an optical semiconductor device, an optical module, and a method for manufacturing an optical semiconductor device.

2. Description of the Related Art

The Internet is established as an infrastructure that is indispensable to modern society from business to home life, and an application range thereof is widened such that the application range is from data processing for business to a portal site, or from a blog to Internet mail order sales, video, e-book or social networking service (SNS). In most cases of Internet communication, used is optical communication that is advantageous for high capacity and long distance through a high-speed router apparatus. Furthermore, it becomes the mainstream that management of the data processing for business, Internet mail order sales or SNS described above is performed at a data center. The respective servers within the data center are connected to each other with optical communication, and an enormous optical communication network is built in the center due to realization of a large scale of the data center. In this manner, Internet-related industries will be developed hereafter, and a transmission volume of optical communication also keeps on increasing. An optical transmitter receiver module is used in the optical communication, and realization of even higher speed is asked due to a demand for the transmission volume expansion. In the high-speed router apparatus or the data center, densification or a power consumption increase of component mounting in the apparatus progresses due to the realization of high speed or the large scale. Therefore, the realization of high speed, and miniaturization and low power consumption are asked for the optical transmitter receiver module.

For the realization of high speed of the optical transmitter receiver module, the realization of high speed of an optical semiconductor device (for example, a semiconductor laser, or a semiconductor laser in which an absorption type modulator is integrated) which is a light source of an optical module having an optical transmission function is necessary. In case of the semiconductor laser, a direct modulation method in which a light intensity is modulated by modulating an injection current is widely applied in general. In this case, in a communication semiconductor laser of a transmission rate of 10 Gb/s or more in recent years, known is a ridge waveguide laser which includes an InGaAlAs-MQW (multiple quantum well) layer used as an active layer, which allows a high frequency of relaxation oscillation, and thus high speed of the optical transmitter receiver module, as proposed by the present inventors in JP 2014-150145A.

SUMMARY OF THE INVENTION

Generally, in the ridge waveguide laser, since there is a diffusion current in a transverse direction in a semiconductor layer under a ridge stripe of the ridge waveguide laser, an effective active layer is broadened, and since a current is transversely diffused to further outside thereof, there is an ineffective current which thus increases a threshold current. In this manner, the reactive current caused by the diffusion current in the transverse direction reduces an effective driving current and a width of the effective active layer is broadened. Thus, the ridge waveguide laser is a disadvantageous structure as compared with a buried hetero (BH) structure which has an active layer buried in a semiconductor layer for increasing the frequency of relaxation oscillation in order to achieve the high-speed operation.

As disclosed in JP 2013-165133A, the inventors offer a buried type laser which uses InGaAlAs as an active layer with long-term reliability, a low threshold current, and a high frequency of relaxation oscillation at a low driving current. In JP2013-165133A, a semiconductor laser is formed on an InP semiconductor substrate, in which, an upper cladding is formed in a mesa stripe of InP;, a layer including a diffraction grating layer, a separate confinement heterostructure (SCH) layer, a multiple quantum well layer (MQW layer) and the like is formed substantially under the upper cladding; and a buried InP layer is disposed on both sides of the diffraction grating layer, the SCH layer, and the MQW layer. This structure allows a laser which is excellent in symmetry of the light, and has high reliability. However, recent acceleration of high speed operation of the optical transceiver module has required a semiconductor laser to achieve even higher speed operation while maintaining high reliability and low threshold current.

Consideration the above mentioned problems, an object of the invention is to provide an optical semiconductor device, an optical module, and a method for manufacturing an optical semiconductor device which have a low threshold current, a high frequency of relaxation oscillation and long-term reliability.

(1) In order to solve the above mentioned problems, an optical semiconductor device according to an aspect of the invention is provided, including: an InP semiconductor substrate; a lower mesa structure that is disposed above the InP semiconductor substrate, and includes a multiple quantum well layer; an upper mesa structure that is disposed on the lower mesa structure, and includes a cladding layer; buried semiconductor layers that are buried on both sides of the lower mesa structure; and an insulating film that covers both sides of the upper mesa structure by being in contact with both sides of the upper mesa structure, in which the lower mesa structure includes a first semiconductor layer above the multiple quantum well layer, the upper mesa structure includes a second semiconductor layer below the cladding layer, and the second semiconductor layer being different from the cladding layer in composition.

(2) In the optical semiconductor device according to (1), a refractive index of the second semiconductor layer may be higher than the refractive index of the cladding layer.

(3) In the optical semiconductor device according to (1) or (2), the second semiconductor layer may be one or more that are selected from a group formed of a diffraction grating layer, a separate confinement heterostructure layer, and an electron stop layer.

(4) In the optical semiconductor device according to any one of (1) to (3), the cladding layer may be an InP layer, and at least one layer of the second semiconductor layer may be a layer of plural kinds of elements including phosphorus (P).

(5) In the optical semiconductor device according to any one of (1) to (4), the first semiconductor layer may be a separate confinement heterostructure layer.

(6) In the optical semiconductor device according to any one of (1) to (5), the multiple quantum well layer may be a layer of plural kinds of elements including aluminum (Al).

(7) In the optical semiconductor device according to (6), the first semiconductor layer may be a layer of plural kinds of elements including Al.

(8) An optical semiconductor device array according to another aspect of the invention is provided, comprising the optical semiconductor devices according to any one of (1) to (7), in which the optical semiconductor devices are disposed on the InP semiconductor substrate side by side.

(9) The optical semiconductor device array according to (8) may further include an isolation groove that isolates the buried semiconductor layer located between the optical semiconductor devices which are adjacent to each other.

(10) According to still another aspect of the invention, there is provided a method for manufacturing an optical semiconductor device including: stacking a lower semiconductor multi-layer and an upper semiconductor multi-layer on an InP semiconductor substrate, the lower semiconductor multi-layer including a multiple quantum well layer and a first semiconductor layer in sequence, and the upper semiconductor multi-layer including a second semiconductor layer and a cladding layer in sequence, the second semiconductor layer being different from the cladding layer in composition; forming an upper mesa structure by forming a first mask that extends along a longitudinal direction of an optical waveguide of the optical semiconductor device on the upper semiconductor multi-layer, and removing one or more portions of the upper semiconductor multi-layer which lie outside of the first mask seen from above the optical semiconductor device; forming a lower mesa structure by removing one or more portions of the lower semiconductor multi-layer which lie outside of a second mask that surrounds an upper surface and sides of the upper mesa structure seen from above the optical semiconductor device; covering both sides of the lower mesa structure with a buried semiconductor layer; and covering both sides of the upper mesa structure and an upper surface of the buried semiconductor layer by being in contact with an insulating film.

(11) An optical module according to sill another aspect of the invention is provided, including the optical semiconductor device according to any one of (1) to (9), and a lens that focuses light emitted from the optical semiconductor device.

The invention provides an optical semiconductor device, an optical module, and a method for manufacturing an optical semiconductor device which have a low threshold current is small, a high frequency of relaxation oscillation and long-term reliability.

DETAILED DESCRIPTION OF THE INVENTION

Figure 1:
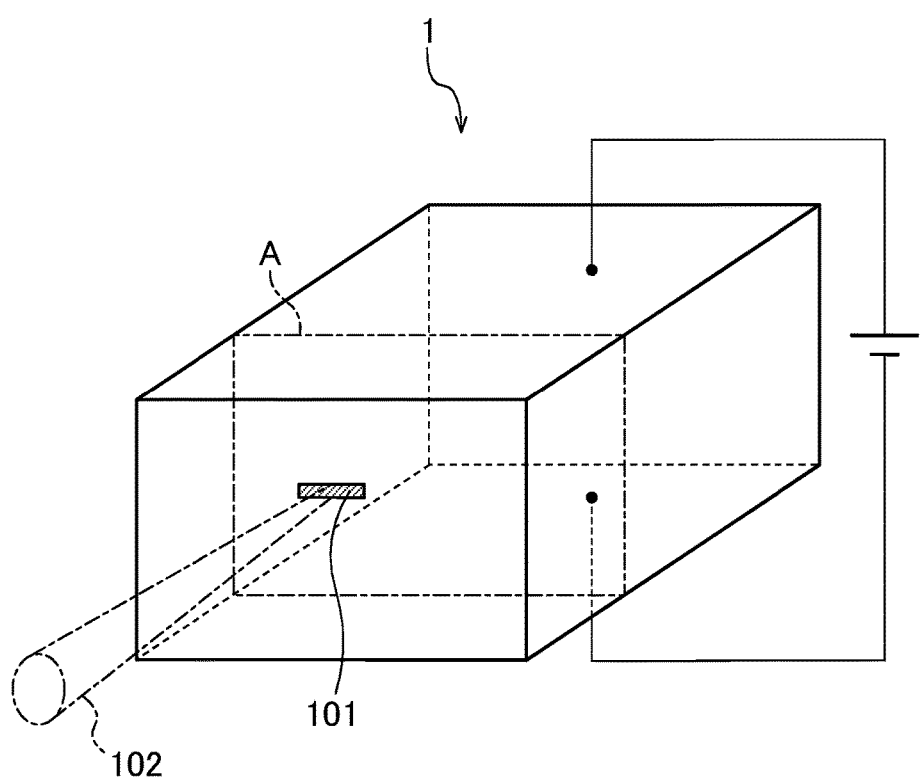
FIG. 1 is a diagram illustrating a schematic configuration of an optical semiconductor device according to a first embodiment of the invention.

Hereinafter, embodiments of the invention will be described with reference to the drawings. In the drawings, the same reference numerals are given to the same or equivalent elements, and repeated description will be omitted.

[First Embodiment]

FIG. 1 is a diagram illustrating a schematic configuration of an optical semiconductor device 1 according to a first embodiment of the invention. The optical semiconductor device 1 illustrated in FIG. 1 is a semiconductor laser, and a voltage is applied to two electrodes disposed on opposite surfaces of a rectangular parallelepiped, thereby, laser light 102 is emitted from an oscillation region 101.

Figure 2:
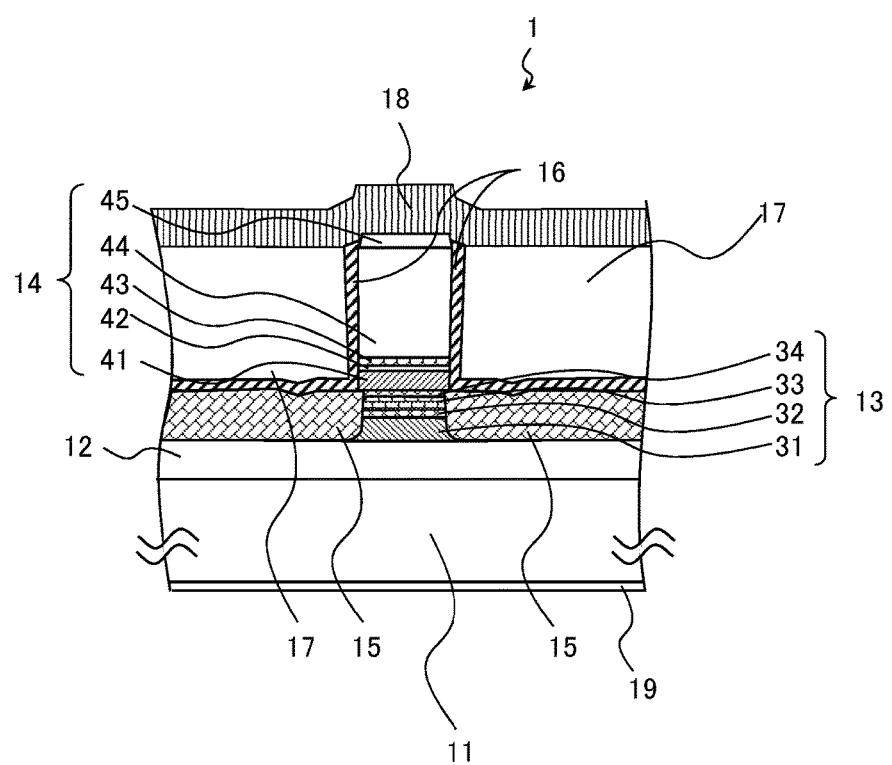
FIG. 2 is a sectional view in a cross section indicated by A of FIG. 1.

FIG. 2 is a sectional view in a cross section indicated by A of FIG. 1. FIG. 2 is a schematic diagram of the cross section perpendicular to an optical axis of a semiconductor laser which is oscillated in a 1.3 μm band of an optical fiber communication transmission light source. The optical semiconductor device 1 is configured to include a p type InP semiconductor substrate 11, a lower cladding layer 12, a lower mesa structure 13, an upper mesa structure 14, a buried semiconductor layer 15 that buries both side surfaces of the lower mesa structure 13, a first insulating layer 16 that covers both sides of the upper mesa structure 14 by being in contact with both sides of the upper mesa structure 14, a second insulating layer 17 that covers the first insulating layer 16, an n type electrode 18 that is configured with Ti/Pt/Au, and a p type electrode 19 that uses AuZn-based elements in a contact electrode. The first insulating layer 16 covers an upper surface of the buried semiconductor layer 15 by being in contact with the upper surface of the buried semiconductor layer 15, in addition to both sides of the upper mesa structure 14. Here, the mesa structure is referred to as a structure in which both sides of a semiconductor multi-layer are removed with respect to a longitudinal direction (direction perpendicular to a paper surface of FIG. 2) of an optical waveguide. In the specification, in a direction (upper and lower directions of FIG. 2) in which the semiconductor layers are stacked on the p type InP semiconductor substrate 11, for the sake of convenience, a side which is close to the p type InP semiconductor substrate 11 is referred to as a lower side, and a side which is opposite thereto is referred to as an upper side. "Ti/Pt/Au" indicates a multi-layered structure in which Ti, Pt, and Au are stacked in sequence.

The lower cladding layer 12 is a p type InP buffer layer of which a doping concentration is $1 \times 10^{18}$ cm$^{-3}$, and a thickness is 1,500 nm.

The lower mesa structure 13 is disposed above the p type InP semiconductor substrate 11, and is configured to include a multiple quantum well layer. The lower mesa structure 13 includes a first semiconductor layer that is disposed above the multiple quantum well layer. In the specification, "to be disposed above the p type InP semiconductor substrate 11" includes both of a case of being disposed separately from the p type InP semiconductor substrate 11 and a case of being disposed in contact with the p type InP semiconductor substrate 11. For example, the first semiconductor layer is a separate confinement heterostructure (SCH) layer having a light confinement effect. Specifically, as illustrated in FIG. 2, the lower mesa structure 13 is configured to include a p type InGaAlAs—SCH layer 31 of which the doping concentration is $1 \times 10^{18}$ cm$^{-3}$, the thickness is 100 nm, and a composition wavelength is 0.93 μm, a p type InAlAs electron stop layer 32 of which the doping concentration is $1 \times 10^{18}$ cm$^{-3}$, and the thickness is 40 nm, a strained InGaAlAs-MQW layer 33 which has a well layer of 8 nm thickness, a barrier layer of 8 nm thickness in six cycles, and emits the light in a 1.3 μm band, and an n type InGaAsP—SCH layer 34 of which the doping concentration is $1 \times 10^{18}$ cm$^{-3}$, the thickness is 30 nm, and the composition wavelength is 0.93 μm. In FIG. 2, the strained InGaAlAs-MQW layer 33 is a multiple quantum well layer, and here, the multiple quantum well layer is a layer formed of multiple elements including an Al element. The n type InGaAlAs—SCH layer 34 is the first semiconductor layer, and here, the first semiconductor layer is a layer of plural kinds of elements including aluminum (Al). A width (width of left and right directions in FIG. 2) of an upper end of the lower mesa structure 13 is 0.8 μm.

The upper mesa structure 14 is disposed on the lower mesa structure 13, and is configured to include a cladding layer. The upper mesa structure 14 is disposed below the cladding layer, and includes a second semiconductor layer which is different from the cladding layer in composition. In the specification, "to be disposed on the lower mesa structure 13" indicates only a case of being disposed in contact with the upper side of the lower mesa structure 13. Additionally, "to be disposed below the cladding layer" includes both of a case of being disposed separately from the cladding layer and a case of being disposed in contact with the cladding layer. In the specification, "to be the same in composition" between two semiconductor layers is referred to as a case where one semiconductor layer consists of the same kinds of elements as the other semiconductor layer consists of. For example, in a case where both of two semiconductor layers are formed of InGaAlAs, two semiconductor layers are the same in composition. In two semiconductor layers which are the same in composition, even if the elements of the dopant (impurities) are different from each other, or dopant concentrations are different from each other, a case of "to be the same in composition" is made. Furthermore, even if proportions of the respective elements of the plural kinds of elements are different from each other, a case of "to be the same in composition" is made. On the contrary, "to be different in composition" between two semiconductor layers is referred to as a case where the respective elements of the plural kinds of elements one semiconductor layer consists of are not fully matched with those the other semiconductor layer consists of. For example, in a case where one semiconductor layer is formed of InP, and the other semiconductor layer is formed of InGaAlAs, two semiconductor layers are different from each other in composition. As described above, in a case where the respective elements of the plural kinds of elements one semiconductor layer consists of are not fully matched with those the other semiconductor layer consists of, even if the respective elements of the plural kinds of elements are different from each other, the elements of the dopant are different from each other, or the dopant concentrations are different from each other, a case of "to be different in composition" is not made.

The second semiconductor layer is one or more that are selected from a group formed of a diffraction grating layer, the separate confinement heterostructure layer, and the electron stop layer. A refractive index of the second semiconductor layer is higher than the refractive index of the cladding layer. Specifically, as illustrated in FIG. 2, the upper mesa structure 14 is configured to include an n type InGaAsP—SCH layer 41 of which the doping concentration is $1 \times 10^{18}$ cm$^{-3}$, and the thickness is 100 nm, an n type InP spacer layer 42 of which the doping concentration is $1 \times 10^{18}$ cm$^{-3}$, and the thickness is 25 nm, an n type InGaAsP diffraction grating layer 43 of which the doping concentration is $1 \times 10^{18}$ cm$^{-3}$, and the thickness is 50 nm, an n type InP cladding layer 44 of which the doping concentration is $1 \times 10^{18}$ cm$^{-3}$, and the thickness is 1.3 μm, and an n-type InGaAsP contact layer 45 of which the doping concentration is $2 \times 10^{19}$ cm$^{-3}$. The InGaAsP diffraction grating layer 43 is disposed in a grating shape in the direction perpendicular to the paper surface of FIG. 2. FIG. 2 illustrates a surface where the InGaAsP diffraction grating layer 43 is present. In FIG. 2, if the n type InGaAsP—SCH layer 41 or the InGaAsP diffraction grating layer 43 becomes the second semiconductor layer, or the n type InGaAsP—SCH layer 41 and the InGaAsP diffraction grating layer 43 become the second semiconductor layer, here, at least one layer of the second semiconductor layer is a layer formed of plural kinds of elements including phosphorus (P). Therefore, the n type InP cladding layer 44 becomes the cladding layer. The width (width of the left and right directions in FIG. 2) of a lower end of the upper mesa structure 14 is 0.9 μm.

The buried semiconductor layer 15 may be a p-type semiconductor layer, a high resistance type (semi-insulating) semiconductor layer of which the dopant is Fe or Ru, a multi-layer film that is formed of a p type semiconductor layer and an n type semiconductor layer, or a multi-layer film that is formed of a high resistance type semiconductor layer, a p type semiconductor layer, and an n type semiconductor layer. In the embodiment, the buried semiconductor layer 15 is a p type InP layer.

The first insulating layer 16 is an insulating film such as SiO$_2$. The second insulating layer 17 is an organic insulating layer such as polyimide, but may be an organic insulating layer or an inorganic insulating layer as long as it is a low-stress insulating layer.

Next, a method for manufacturing an optical semiconductor device 1 according to the embodiment will be described with reference to FIG. 3A to FIG. 3F. FIG. 3A to FIG. 3F are diagrams schematically illustrating a process of the method for manufacturing the optical semiconductor device 1 according to the embodiment.

Figure 3A:
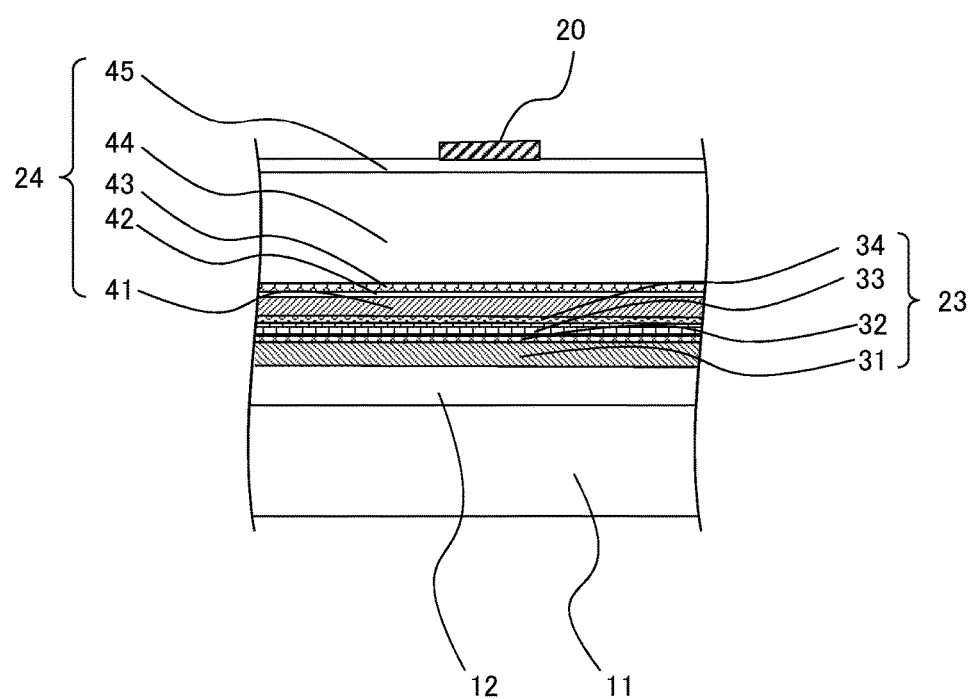
FIG. 3A to FIG. 3F are diagrams schematically illustrating a process of a method for manufacturing an optical semiconductor device according to the embodiment.

First, in the p type InP semiconductor substrate 11, a lower semiconductor multi-layer 23 including the multiple quantum well layer and the first semiconductor layer in sequence, and an upper semiconductor multi-layer 24 including the second semiconductor layer and the cladding layer in sequence are stacked in sequence (semiconductor multi-layer stacking process: FIG. 3A). Here, on the p type InP semiconductor substrate 11, the lower cladding layer 12, the lower semiconductor multi-layer 23 including the p type InGaAlAs—SCH layer 31, the p type InAlAs electron stop layer 32, the strained InGaAlAs-MQW layer 33 (multiple quantum well layer), and the n type InGaAlAs—SCH layer 34 (first semiconductor layer) in sequence, and the upper semiconductor multi-layer 24 including the n type InGaAsP—SCH layer 41 (second semiconductor layer), the InP spacer layer 42, the InGaAsP diffraction grating layer 43, the n type InP cladding layer 44 (cladding layer), and the InGaAsP contact layer 45 in sequence are stacked by using known metal organic chemical vapor deposition (MOCVD). The InGaAsP diffraction grating layer 43 maybe the second semiconductor layer. After the diffraction grating layer 43 is formed by the MOCVD, a diffraction grating is formed by etching so as to be a desired wavelength. Thereafter, then type InP cladding layer 44, and the InGaAsP contact layer 45 are formed by the MOCVD.

Figure 3B:
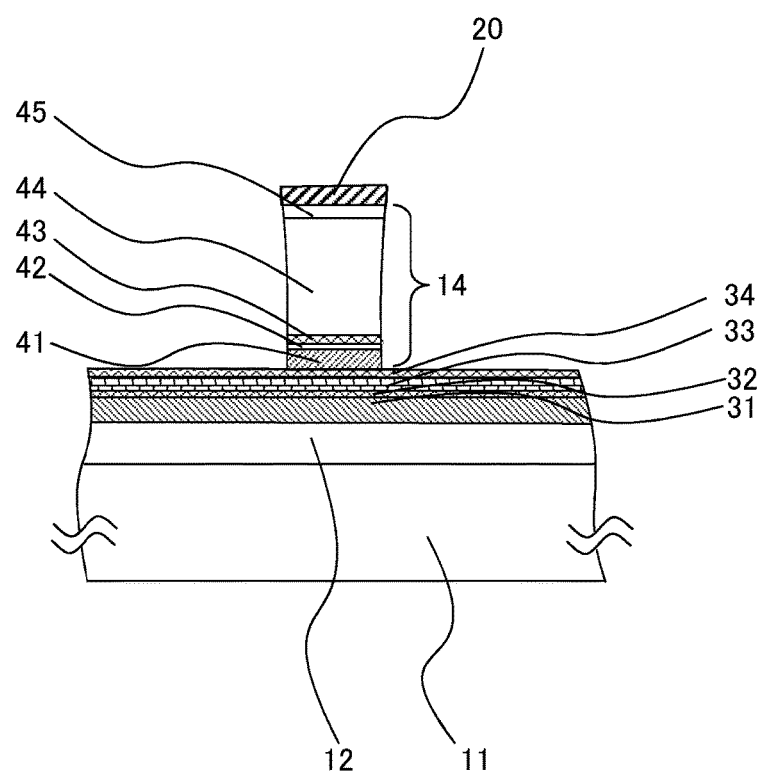

Next, a first mask 20 which extends in the extending direction of the optical waveguide is formed on the upper semiconductor multi-layer 24. By using the first mask 20, a portion which is on an outside (both left and right sides in FIG. 2) of the first mask 20 is removed in the upper semiconductor multi-layer 24, and the upper mesa structure 14 is formed (upper mesa structure forming process: FIG. 3B). Here, a silicon dioxide film (SiO$_2$) is used as a first mask 20, dry etching is performed with reactive ion etching (RIE) using a mixed gas of methane, oxygen, and hydrogen, thereby, the upper mesa structure 14 which is configured with a stacked body of then type InGaAsP—SCH layer 41 (second semiconductor layer), the InP spacer layer 42, the InGaAsP diffraction grating layer 43, the n type InP cladding layer 44 (cladding layer), and the InGaAsP contact layer 45 is formed. In the dry etching, since a rate of the InGaAlAs layer is very small in comparison with an etching rate of the InGaAsP layer, the etching is substantially stopped at a boundary between then type InGaAsP—SCH layer 41 (second semiconductor layer) and the n type InGaAsP—SCH layer 34. Since it is possible to perform the etching in the n type InP cladding layer 44 (cladding layer) approximately vertically with a mixed solution of hydrochloric acid and phosphoric acid, wet etching is performed in the n type InP cladding layer 44 (cladding layer), after the dry etching is performed in the InGaAsP contact layer 45. Thereafter, the dry etching may be performed in the n type InGaAsP—SCH layer 41 (second semiconductor layer), the InP spacer layer 42, and the InGaAsP diffraction grating layer 43.

Figure 3C:
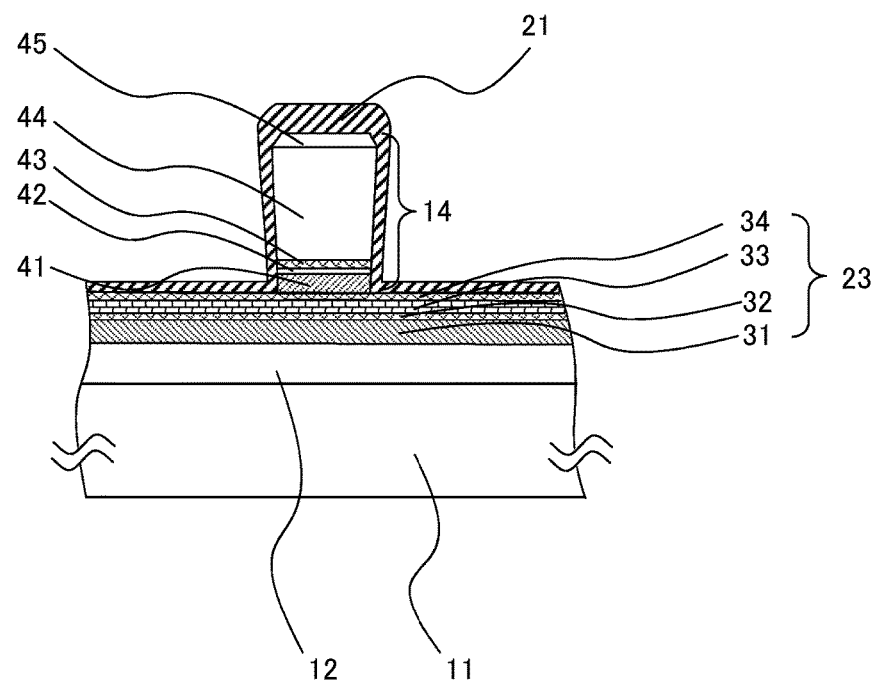
Figure 3D:
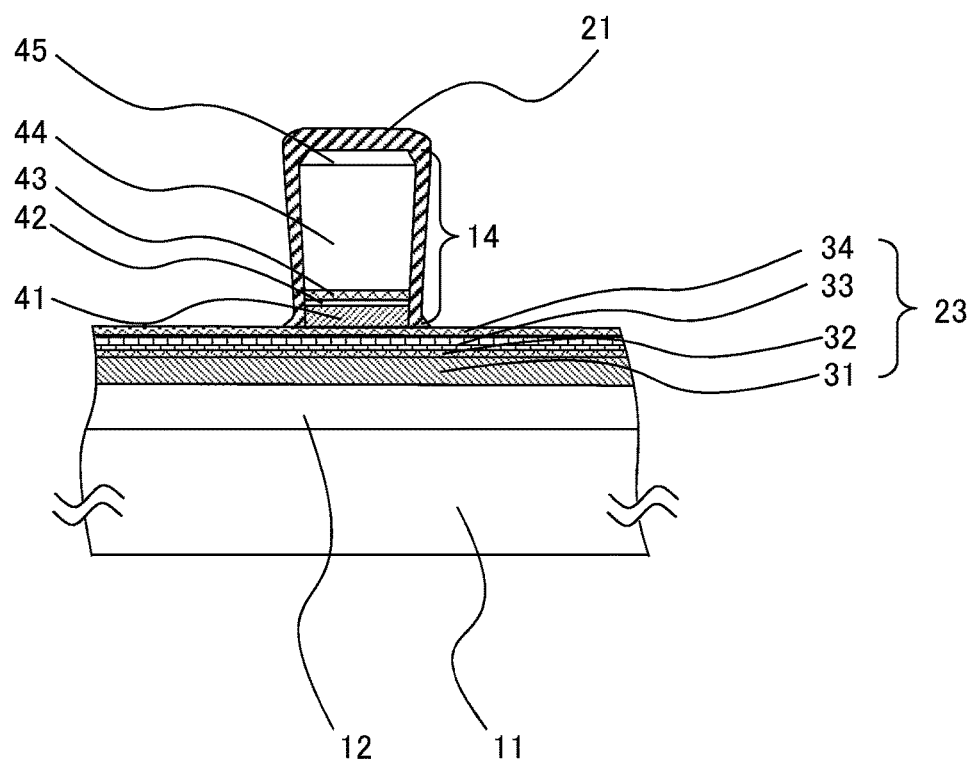
Figure 3E:
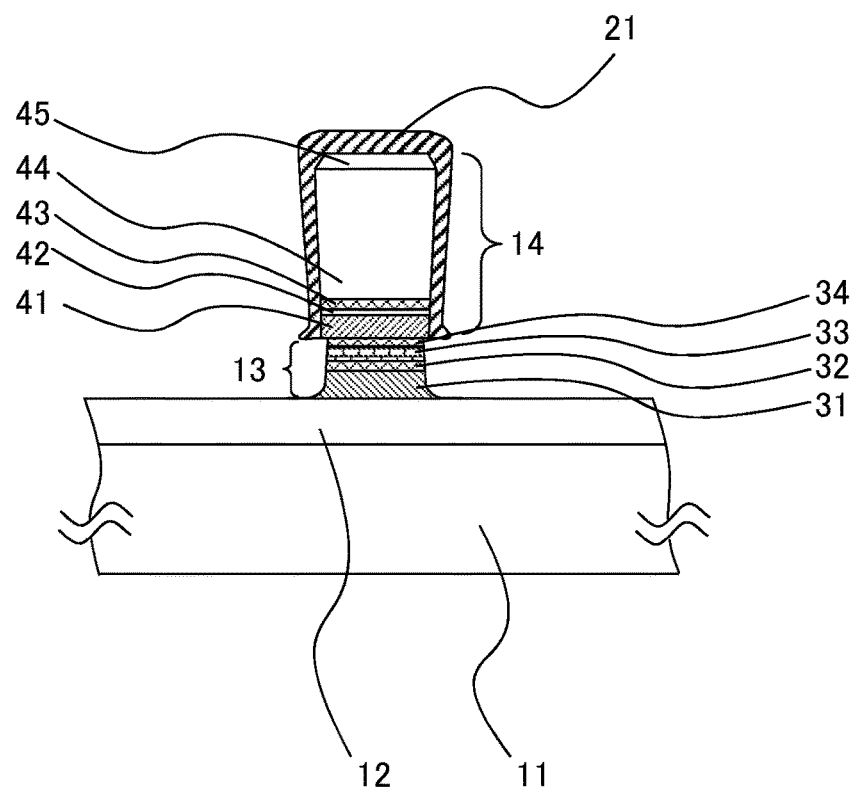

Thereafter, the lower semiconductor multi-layer 23 other than a region which will be the lower mesa structure 13 later is removed, and the lower mesa structure 13 is formed (lower mesa structure forming process: FIG. 3C to FIG. 3E). First, as illustrated in FIG. 3C, a second mask 21 of a silicon dioxide film (SiO$_2$) is formed on the upper surface and the side surface of the upper mesa structure 14, and the upper surface of the lower semiconductor multi-layer 23. Next, anisotropic dry etching of the second mask 21 is performed in self-aligned (self-alignment) manner, thereby, a shape of the second mask 21 is changed so as to surround the upper surface and the side surface of the upper mesa structure 14, and to have eaves at a lower portion as illustrated in FIG. 3D. In FIG. 3C, in the upper surface of the upper mesa structure 14, since the silicon dioxide film (SiO2) is formed on the first mask 20 which is formed in the upper mesa structure forming process, and the first mask 20 and the newly formed silicon dioxide film (SiO$_2$) become the second mask 21 in combination thereof, a film thickness of the second mask 21 in the upper surface of the upper mesa structure 14 is larger than the film thickness of the second mask 21 in the upper surface of the lower semiconductor multi-layer 23. Accordingly, by performing the anisotropic dry etching, the second mask 21 which is formed in the upper surface of the lower semiconductor multi-layer 23, and has small film thickness is removed, and the second mask 21 is changed into a shape surrounding the upper surface and the side surface of the upper mesa structure 14 as illustrated in FIG. 3D. The eaves of the second mask 21 may be made by forming the upper mesa structure 14 into an isosceles trapezoidal shape in which the lower side becomes a short side, or may be formed by performing new patterning with a high accuracy semiconductor exposure apparatus such as a stepper or an electron beam drawing apparatus. Moreover, it is possible to control equivalently an eave width by controlling the film thickness of the silicon dioxide film (SiO$_2$). Only In (Ga) AlAs is selected, and the wet etching is performed with an aqueous solution, for example, the wet etching is performed with a mixed solution of phosphoric acid, hydrogen peroxide solution, and water or a mixed solution of sulfuric acid, hydrogen peroxide solution, and water, thereby, the portion that is on the outside of the second mask 21 surrounding the upper surface and the side surface of the upper mesa structure 14 is removed in the lower semiconductor multi-layer 23, and the lower mesa structure 13 that is configured with the stacked body of the p type InGaAsP—SCH layer 31, the p type InAlAs electron stop layer 32, the strained InGaAlAs-MQW layer 33 (multiple quantum well layer), and then type InGaAlAs—SCH layer 34 (first semiconductor layer) is formed, as illustrated in FIG. 3E. At the time of forming the lower mesa structure 13, the lower cladding layer 12, or the InP semiconductor substrate 11 may be etched by performing the wet etching with a mixed solution of HBr, hydrogen peroxide solution, and water. Alternatively, at the time of forming the lower mesa structure 13, the dry etching may be used, or the dry etching and the wet etching may be used in combination.

Figure 3F:
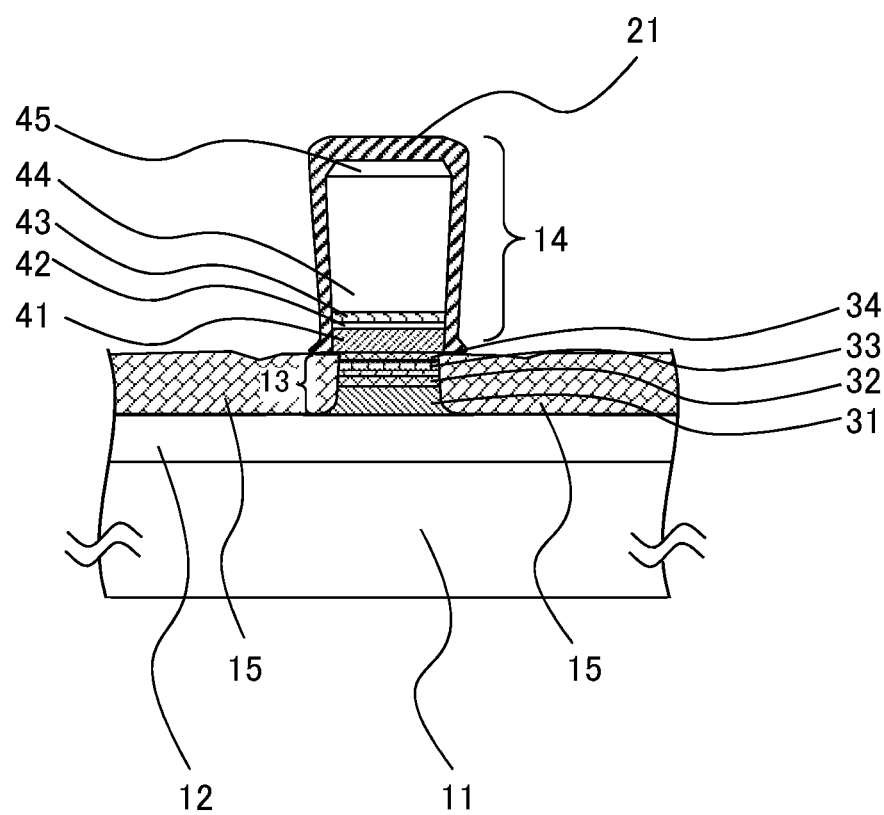

Both side surfaces of the lower mesa structure 13 are buried with the buried semiconductor layer 15 (buried process: FIG. 3F). Here, a p type InP of which the doping concentration is $7 \times 10^{17}$ cm$^{-3}$ is buried by using the known MOCVD. The thickness of the buried semiconductor layer 15 in a stacked direction is substantially equal to a height which is from the upper surface of the lower cladding layer 12 to the lower surface of the eaves. In other words, the buried semiconductor layer 15 buries both side surfaces of the lower mesa structure 13 until both side surfaces of the lower mesa structure 13 are sufficiently covered. In this manner, since a crystal defect at an interface becomes very small by burying the side surface of an Al-based multiple quantum well layer with the buried semiconductor layer 15, long-term reliability is obtained. The semi-insulating InP, that is, the InP in which Ru or Fe is doped may be applied to the buried semiconductor layer 15. In this case, it is considered to be degraded in comparison with a case of being buried with the p type InP, from the viewpoint of a leakage current. However, if this case is compared with a buried structure in which the buried semiconductor layer 15 buries all of the side surfaces of the lower mesa structure 13 and the upper mesa structure 14 by being in contact with all of the side surfaces of the lower mesa structure 13 and the upper mesa structure 14, since the side surface of the upper mesa structure 14 is not in contact with the buried semiconductor layer 15 in the embodiment, it is considered that the leakage current through the interface of the buried semiconductor layer 15 is small.

Thereafter, both side surfaces of the upper mesa structure 14, and the upper surface of the buried semiconductor layer 15 are covered by being in contact with the insulating film (insulating film forming process). Here, after the second mask 21 is removed once in FIG. 3F, the first insulating layer 16 which is configured with a silicon dioxide film (SiO$_2$) is formed so as to cover the upper surface and the side surface of the upper mesa structure 14, and the upper surface of the buried semiconductor layer 15 by being in contact with the upper surface and the side surface of the upper mesa structure 14, and the upper surface of the buried semiconductor layer 15. The second insulating layer 17 which is configured with polyimide is formed so as to cover the first insulating layer 16 by being in contact with the first insulating layer 16, and the first insulating layer 16 which formed in the upper surface of the upper mesa structure 14 is exposed by etch back. Thereafter, the first insulating layer 16 which is formed in the upper surface of the upper mesa structure 14 is removed, and the n type electrode 18 is formed thereon. The p type electrode 19 is formed below the lower cladding layer 12. The first insulating layer 16, and the second insulating layer 17 may be formed so as to cover the second mask 21, without removing the second mask 21 once.

Here, in the optical semiconductor device 1 according to the first embodiment illustrated in FIG. 2, and the ridge waveguide laser of the related art, values which are obtained by dividing a light confinement coefficient per one quantum by a width (referred to as a lower mesa width, hereinafter) of the upper end of the lower mesa structure 13 are compared with each other. A relaxation oscillation frequency $f_r$ has the following relationship between a driving current $I_m$ (=operating current−threshold current), a lower mesa width $W_a$, and a light confinement coefficient $\Gamma_{QW}$ per one well in the multiple quantum well.

[Math. 1]

$$f_r \propto \sqrt{\frac{\Gamma_{QW} I_m}{W_a}} \quad (1)$$

Figure 4:
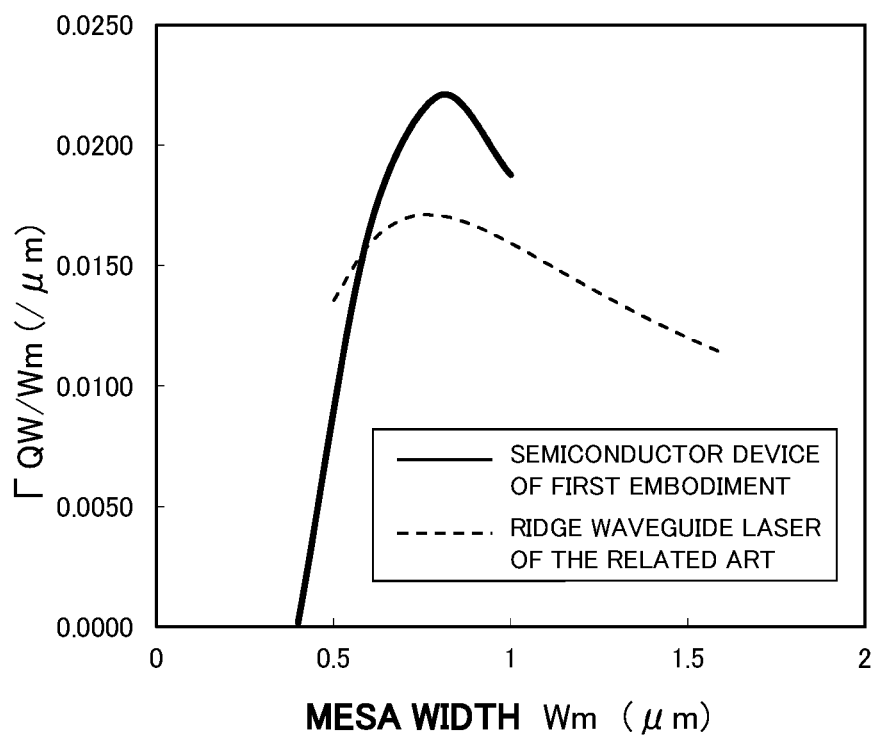
FIG. 4 is a diagram illustrating a calculated value of $\Gamma_{QW}/W_a$ with respect to a lower mesa width $W_a$.

By Mathematical expression (1), it is understood that a laser structure in which $\Gamma_{QW}/W_a$ increases is desirable. FIG. 4 is a diagram illustrating a calculated value of $\Gamma_{QW}/W_a$ with respect to the lower mesa width $W_a$. FIG. 4 illustrates the calculated value of $\Gamma_{QW}/W_a$ with respect to the lower mesa width $W_a$ in the ridge waveguide laser of the related art, and the optical semiconductor device 1 according to the first embodiment. Here, the multiple quantum well layers have the same structures in the ridge waveguide laser of the related art, and the optical semiconductor device 1 according to the first embodiment. The mesa width of the ridge waveguide laser of the related art is defined by the width of a ridge stripe portion, and the calculation is performed.

As understood from FIG. 4, in the optical semiconductor device 1 according to the first embodiment, $\Gamma_{QW}/W_a$ noticeably increases in the vicinity of the lower mesa width which is 0.8 μm in comparison with the ridge waveguide laser, and increases as approximately 30 percent in comparison with the ridge waveguide laser. In the ridge waveguide laser, since the multiple quantum well layer, and the separate confinement heterostructure layer which is above the multiple quantum well layer do not have the mesa structures, the width of an effective active layer is large. On the contrary, in the optical semiconductor device 1 according to the first embodiment, since the multiple quantum well layer, and the separate confinement heterostructure layer (n type InGaAsP—SCH layer 41) have the mesa structures, the active layer width is small, and it is possible to make $\Gamma_{QW}$ large in comparison with the ridge waveguide laser. The film thickness of the n type InP cladding layer 44 is a value that is obtained by dividing a length of an oscillation wavelength of the laser within the semiconductor, that is, 1.3 μm by the refractive index of the n type InP cladding layer 44, and there is a need to be 400 nm or more.

If compared with the buried type laser (referred to as a comparative example, hereinafter) disclosed in JP 2013-165133A, a region which is covered with the buried semiconductor layer 15 is different from each other. In the comparative example, even a lower portion of the InP cladding layer on the upper side is buried, whereas in the optical semiconductor device 1 according to the first embodiment, the n type InGaAsP—SCH layer 41 or the like is not buried. In other words, the optical semiconductor device 1 of the embodiment has the structure in which the buried region thereof is small in a transverse direction. Since a light confinement rate becomes large as a refractive index difference of the region which becomes a target is large, if the light confinement rates of the non-buried region and the buried region are compared with each other, the light confinement rate becomes large in the non-buried region. That is, if the comparative example and the optical semiconductor device 1 are compared with each other, the light confinement rate becomes large on the whole in the embodiment of which the non-buried region is large. As a result, it is possible to make $\Gamma_{QW}$ large.

Considering only the light confinement rate as described above, it is possible to make $\Gamma_{QW}$ large in a case of no buried semiconductor layer, but reliability is largely concerned in a case where the multiple quantum well layer is not buried. From the viewpoint of reliability, it is not desirable that the multiple quantum well layer is into contact with the outside (outside air) directly, or through the insulating film through which moisture or the like passes. Therefore, there is a need to enhance the reliability by covering the multiple quantum well layer with the buried semiconductor layer. As described above, in order to enhance high-speed response performance by making the relaxation oscillation frequency large, and to secure high reliability, it is effective that the buried semiconductor layer covers at least up to the multiple quantum well layer, and covers up to any between the multiple quantum well layer and the lower portion of the cladding layer on the upper side from the multiple quantum well layer. That is, as illustrated in the first embodiment, in the upper mesa structure 14 which is not covered with the buried semiconductor layer 15, there is a need to form a structure such that the cladding layer (n type InP cladding layer 44), and the second semiconductor layer (n type InGaAP—SCH layer 41) of which the refractive index is higher than that of the cladding layer are included.

Since the multiple quantum well layer does not have the mesa structure in the ridge waveguide laser of the related art, the effective active layer width becomes large so that the injected current is spread in the transverse direction of the multiple quantum well layer. Since the multiple quantum well layer has the mesa structure in the optical semiconductor device 1 according to the first embodiment, the effective active layer width is small, and it is possible to make the relaxation oscillation frequency large from this point.

In the embodiment, the p type InP semiconductor substrate is used, and the n type InP cladding layer is adopted in the upper mesa structure 14. In the related art, there are many cases where the n type InP semiconductor substrate is used, and the p type InP cladding layer serves as an upper mesa structure, but since resistivity of the p type InP cladding layer is high in comparison the n type InP cladding layer, the width of the lower mesa structure is widely set to be approximately 1.3 μm to 1.7 μm in order to prevent high resistance realization of the entire device. Accordingly, as illustrated in FIG. 4, $\Gamma_{QW}/W_a$ is a rather low value in the ridge waveguide laser of the related art. On the other hand, since the n type InP cladding layer of which the resistivity is low is adopted in the optical semiconductor device 1 according to the first embodiment, the resistance of the device does not increase even if the vicinity of 0.8 μm in which $\Gamma_{QW}/W_a$ becomes maximum is set as a lower mesa width. In consideration of the settable lower mesa width, it is possible to enhance $\Gamma_{QW}/W_a$ up to approximately twice in the semiconductor device 1 according to the first embodiment in comparison with the ridge waveguide laser of the related art.

In the optical semiconductor device 1 in which a resonator length is 150 μm, a non-reflection coating of 0.5% or less is performed on a front end surface, and a high reflection coating of 90% is performed on a rear end surface, the low threshold currents of 1.2 mA at a temperature of 25° C., and 2.8 mA at a high temperature of 85° C., are obtained. A characteristic temperature of the threshold current is 71 K which is the favorable value regardless of the small threshold current.

Slope efficiencies are 0.28 W/A at 25° C., and 0.25 W/A at 85° C., respectively, which are favorable. Slopes of the relaxation oscillation frequency $f_r$ relative to a square root of the driving current are 6.2 GHz/mA$^{1/2}$ at 25° C., and 4.3 GHz/mA$^{1/2}$ at 85° C., respectively, and good characteristics are obtained. An estimated lifetime at 85° C. is $3.2 \times 10^5$ hours, and it is possible to obtain high reliability.

In this manner, according to the optical semiconductor device 1 of the first embodiment, the second semiconductor layer of which the refractive index is higher than that of the cladding layer is included below the cladding layer in the upper mesa structure 14, thereby, the light confinement rate and the relaxation oscillation frequency in the upper mesa structure 14 increase. Accordingly, it is possible to realize speed improvement of the optical semiconductor device 1. Furthermore, in the optical semiconductor device 1 according to the first embodiment, it is possible to realize low threshold current and high reliability.

In the first embodiment, the lower mesa width (here, the width of then type InGaAsP—SCH layer 34) is 0.8 μm, which is slightly smaller than the width of the lower end of the upper mesa structure 14 (here, the width of the n type InGaAsP—SCH layer 41) (referred to as an upper mesa width, hereinafter), but the lower mesa width may be equal to the upper mesa width, or may be larger than the upper mesa width. In a case where the lower mesa width is smaller than the upper mesa width, the buried semiconductor layer 15 may be in contact with a portion of the n type InGaAsP—SCH layer 41 so as to form a leakage path. However, if the contact portion is small, the leakage current is considered to be small. The lower mesa width, which is desirable from the viewpoint of the leakage current, is −0.5 μm to +1.5 μm with respect to the upper mesa width. Here, the maximum value is determined in a range in which the current can be sufficiently diffused in the transverse direction and a range in which light distribution can sufficiently arrive when the laser is oscillated. A more desirable range is −0.3 μm to +0.7 μm, and in the range, the leakage current is small, and the maximum value thereof is a range in which the light confinement coefficient becomes large. The upper mesa width is preferably 0.4 μm to 1.3 μm in which a transverse mode of laser oscillation light is oscillated in a base mode.

In the first embodiment, the n type InGaAlAs—SCH layer 34 and the n type InGaAsP—SCH layer 41 are formed in contact with each other, but from the viewpoint of uniformity of crystal growth, a thin InP layer may be inserted between the n type InGaAlAs—SCH layer 34 and the n type InGaAsP—SCH layer 41. In this case, since the light is not likely to be affected if the thickness of the InP layer is approximately ⅛ or less of the length of the oscillation wavelength within the semiconductor, that is, 50 nm or less, the light confinement effect to the upper mesa structure 14 is not changed. This similarly occurs in the InP spacer layer 42 which is disposed below the InGaAsP diffraction grating layer 43.

The n type InGaAsP—SCH layer 34 may be formed as an n type InGaAsP—SCH layer which is integrated into the n type InGaAsP—SCH layer 41. In this case, it is possible to set the lower end of the upper mesa structure 14 to be the lower end or more of the integrated n type InGaAsP—SCH layer, and to be less than the upper end of the integrated n type InGaAsP—SCH layer. It is possible to control the position of the lower end of the upper mesa structure 14 by measuring an etching depth with laser interference, or determining the depth from plasma emission of reactive atoms for the dry etching. Here, in terms of viewpoint of how far the layer of which the refractive index is higher than that of the cladding layer is put into the upper mesa structure 14, it is desirable that a lower limit is the upper end or more of the uppermost quantum well layer within the strained InGaAlAs-MQW layer 33, and an upper limit is less than the upper end of the InGaAsP diffraction grating layer 43 of which the refractive index is higher than that of the cladding layer.

In the above description, the single optical semiconductor device 1 is used as an example, but even in a case of being applied to an array type optical semiconductor device in which a plurality of optical semiconductor devices 1 are disposed side by side on the InP semiconductor substrate, the similar effect is obtained.

[Second Embodiment]

Figure 5:
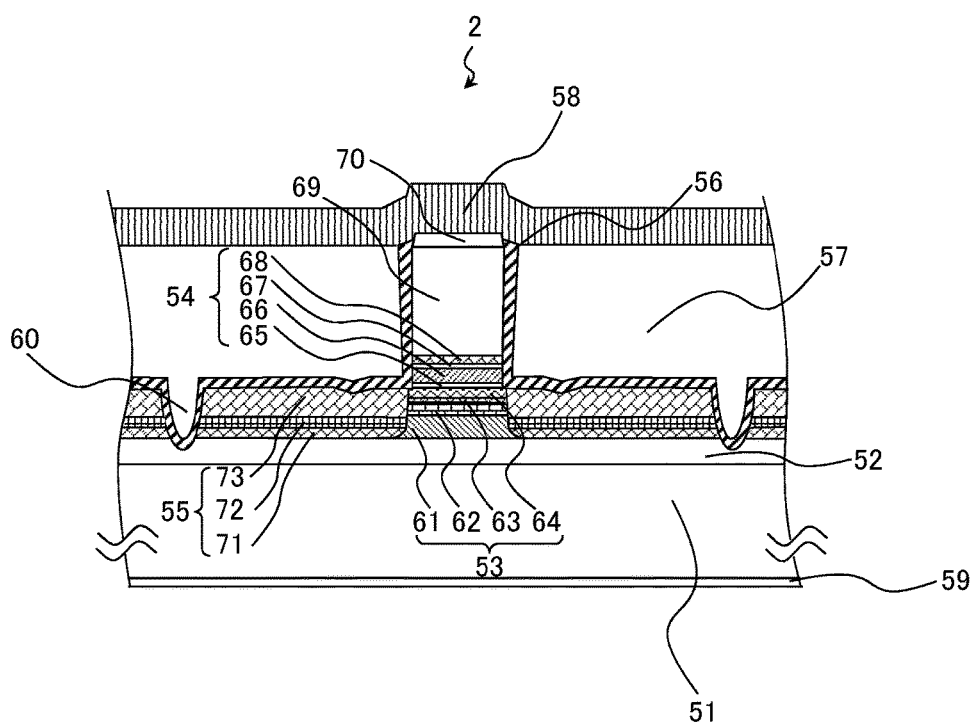
FIG. 5 is a sectional view of an optical semiconductor device according to a second embodiment of the invention.

FIG. 5 is a sectional view of an optical semiconductor device 2 according to a second embodiment of the invention. FIG. 5 is a schematic diagram of the cross section perpendicular to the optical axis of the optical semiconductor device 2 which is oscillated in a 1.3 μm band of the optical fiber communication transmission light source. The optical semiconductor device 2 of the second embodiment is configured to include an n type InP semiconductor substrate 51, a lower cladding layer 52, a lower mesa structure 53, an upper mesa structure 54, a buried semiconductor layer 55 that buries both side surfaces of the lower mesa structure 53, a first insulating layer 56 that covers both side surfaces of the upper mesa structure 54 by being in contact with both side surfaces of the upper mesa structure 54, a second insulating layer 57 that covers the first insulating layer 56, a p type electrode 58 that is configured with Ti/Pt/Au, and an n type electrode 59 that uses AuGe-based elements in the contact electrode.

The lower cladding layer 52 is an n type InP buffer layer of which the doping concentration is $1 \times 10^{18}$ cm$^{-3}$, and the thickness is 500 nm.

The lower mesa structure 53 has an n type InGaAsP—SCH layer 61 of which the doping concentration is $1 \times 10^{18}$ cm$^{-3}$, the thickness is 100 nm, and the composition wavelength is 0.93 μm, a strained InGaAlAs-MQW layer 62 which has a well layer of 5.5 nm thickness, a barrier layer of 7 nm thickness in seven cycles, and emits the light in a 1.3 μm band, a p type InAlAs electron stop layer 63 of which the doping concentration is $8 \times 10^{17}$ cm$^{-3}$, and the thickness is 30 nm, and a p type InGaAsP—SCH layer 64 of which the doping concentration is $8 \times 10^{18}$ cm$^{-3}$, the thickness is 50 nm, and the composition wavelength is 0.93 μm. In FIG. 5, the strained InGaAlAs-MQW layer 62 is a multiple quantum well layer, and the p type InAlAs electron stop layer 63 or the p type InGaAlAs—SCH layer 64 is the first semiconductor layer, or the p type InAlAs electron stop layer 63 and the p type InGaAsP—SCH layer 64 are the first semiconductor layer.

The upper mesa structure 54 is configured to include a p type InP spacer layer 65 of which the doping concentration is $8\times10^{17}$ cm$^{-3}$, and the thickness is 5 nm, a p type InGaAsP—SCH layer 66 of which the doping concentration is $1\times10^{18}$ cm$^{-3}$, the thickness is 80 nm, and the composition wavelength is 1.15 µm, a p type InP spacer layer 67 of which the doping concentration is $1\times10^{18}$ cm$^{-3}$, and the thickness is 25 nm, a p type InGaAsP diffraction grating layer 68 of which the doping concentration is $1\times10^{18}$ cm$^{-3}$, and the thickness is 50 nm, a p type InP cladding layer 69 of which the doping concentration is $1\times10^{18}$ cm$^{-3}$, and a p type InGaAs contact layer 70 of high concentration. In FIG. 5, the p type InGaAsP—SCH layer 66 or the p type InGaAsP diffraction grating layer 68 becomes the second semiconductor layer, or the p type InGaAsP—SCH layer and the p type InGaAsP diffraction grating layer 68 become the second semiconductor layer, and the p type InP cladding layer 69 becomes the cladding layer. The width of the lower end of the upper mesa structure 54 is 0.75 µm.

The buried semiconductor layer 55 is configured with three layers of InP, and is configured to include a p type InP layer 71 of which the doping concentration is $4\times10^{17}$ cm$^{-3}$, an n type InP layer 72 of which the doping concentration is $1\times10^{18}$ cm$^{-3}$, and a p type InP layer 73 of which the doping concentration is $8\times10^{17}$ cm$^{-3}$.

The first insulating layer 56 is an insulating film such as SiO$_2$. The second insulating layer 57 is an organic insulating film such as polyimide, but may be an organic insulating film or an inorganic insulating film as long as it is a low-stress insulating layer.

In the second embodiment, an isolation groove 60 for a volume reduction of the buried semiconductor layer 55 which is configured with three layers of InP is formed. The isolation groove 60 is formed by being separated from the upper mesa structure 54 as 1.5 µm or more. In the optical semiconductor device in which a plurality of optical semiconductor devices 2 are disposed side by side on the InP semiconductor substrate, the isolation groove 60 is formed so as to isolate the buried semiconductor layer 55 which is disposed between the optical semiconductor devices 2 which are adjacent to each other.

The width of the upper end of the lower mesa structure 53, that is, the width of the upper end of the p type InGaAlAs—SCH layer 64 is 0.79 µm, which is larger than the width of the lower end of the upper mesa structure 54.

It is possible to apply the same manufacturing method as the first embodiment to a method for manufacturing the optical semiconductor device 2 according to the second embodiment.

In the optical semiconductor device 2 according to the second embodiment, the non-reflection coating of 0.1% or less is performed on the front end surface, and the high reflection coating of 95% is performed on the rear end surface. The resonator length is 130 µm, and a diffraction grating structure in which λ/4 shift is provided at a position of 40 µm from the rear end surface is made. In the optical semiconductor device 2 according to the second embodiment, the threshold currents at 25° C. and 85° C. are respectively 1.1 mA, and 3.2 mA, and low threshold currents are obtained. The characteristic temperature of the threshold current is 56 K which is the favorable value regardless of the small threshold current.

The slope efficiencies are 0.24 W/A at 25° C., and 0.18 W/A at 85° C., respectively, which are favorable. The slopes of the relaxation oscillation frequency $f_r$ relative to the square root of the driving current are 6.3 GHz/mA$^{1/2}$ at 25° C., and 4.3 GHz/mA$^{1/2}$ at 85° C., respectively, and good characteristics are obtained. The estimated lifetime at 85° C. is $1.9\times10^5$ hours, and it is possible to obtain high reliability.

In the second embodiment, the buried semiconductor layer 55 is configured of three layers, but in the same manner as the first embodiment, only the p type InP layer may be used, a high resistance buried layer in which Fe or Ru is doped may be used, or a buried layer which is multi-layered by selecting Fe, Ru, n type, p type or the like may be used. In the second embodiment, the semiconductor laser which is made by using the n type InP semiconductor substrate is described, but it is possible to form the similar semiconductor laser by using the InP semiconductor substrate in which Fe is doped, which is a semi-insulating substrate. At this time, the thickness of the n type InP buffer layer of the lower cladding layer 52 is a thickness of approximately 3 µm. Since it is possible to realize electrical insulating of the devices which are adjacent to each other in an array state of the semiconductor laser by using the Fe-doped InP semiconductor substrate, it is possible to realize mounting and driving of a multi-channel laser array. In this case, an n electrode is adopted not from the substrate side, and is adopted from the region where the active layer is not present on the upper surface side.

[Third Embodiment]

Figure 6:
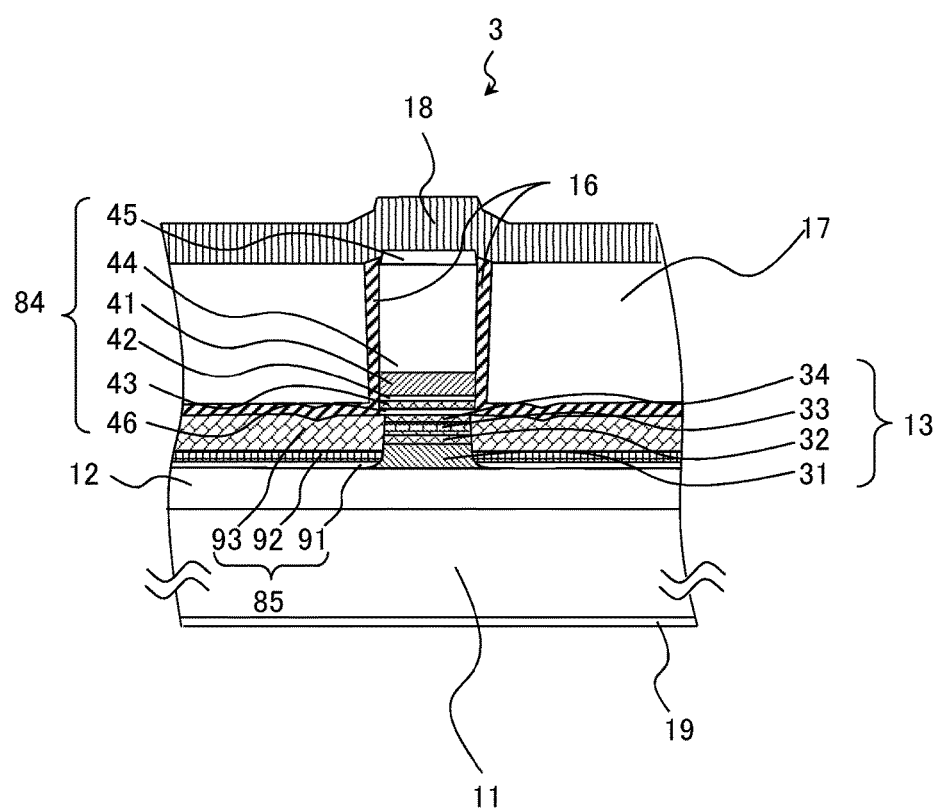
FIG. 6 is a sectional view of an optical semiconductor device according to a third embodiment of the invention.
Figure 7:
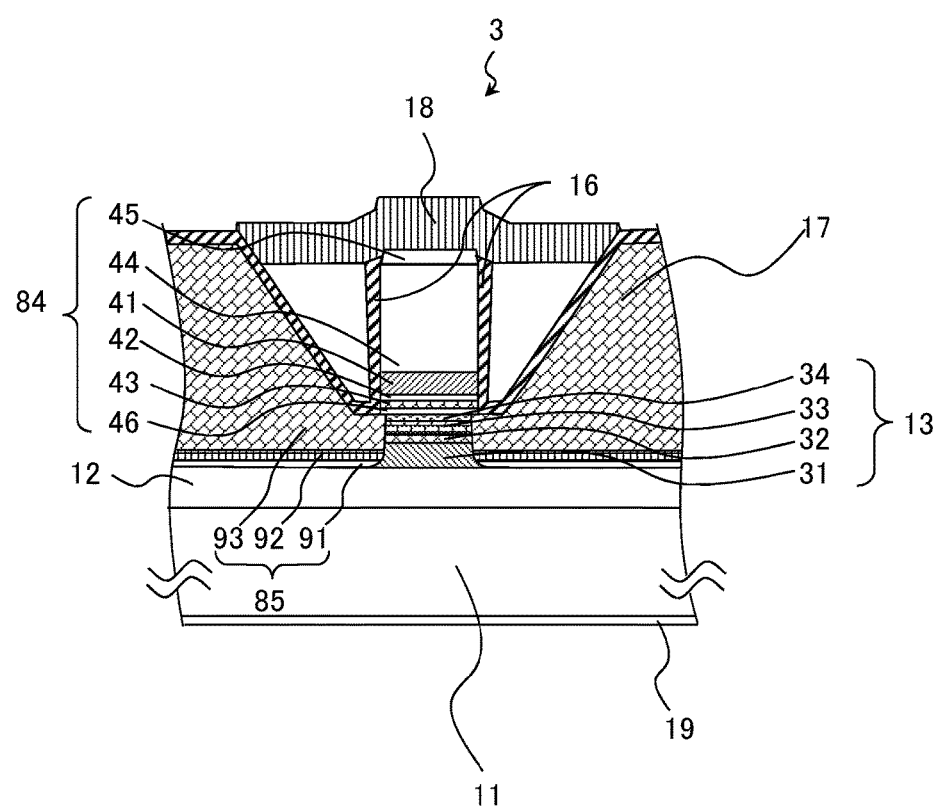
FIG. 7 is a sectional view of the optical semiconductor device according to the third embodiment of the invention.

FIG. 6 and FIG. 7 are sectional views of an optical semiconductor device 3 according to a third embodiment of the invention. FIG. 6 and FIG. 7 are schematic diagrams of the cross section perpendicular to the optical axis of the optical semiconductor device 3 which is oscillated in a 1.3 µm band of the optical fiber communication transmission light source. Since the optical semiconductor device 3 according to the third embodiment is the same as the optical semiconductor device 1 according to the first embodiment except that the configurations of an upper mesa structure 84 and a buried semiconductor layer 85 are different, repeated description will be omitted.

In the upper mesa structure 84 of the optical semiconductor device 3 according to the third embodiment, the positions of the n type InGaAsP—SCH layer 41 and the InGaAsP diffraction grating layer 43 are reversed in comparison with the first embodiment. Specifically, in the upper mesa structure 84 of the third embodiment, on the lower mesa structure 13, an n type InP spacer layer 46, the n type InGaAsP diffraction grating layer 43, the n type InP spacer layer 42, the n type InGaAsP—SCH layer 41, the n type InP cladding layer 44, and an InGaAsP contact layer 45 are formed in sequence. By the configuration, it is possible to increase a coupling coefficient of the diffraction grating.

In the buried semiconductor layer 85 of the optical semiconductor device 3 according to the third embodiment, a p type InP layer 91, an n type InP layer 92, and a Fe-doped InP layer 93 are formed in this sequence on the lower cladding layer 12. By burying the Fe-doped InP layer 93 through the n type InP layer 92, it is possible to prevent the mutual diffusion of Fe and Zn.

In the method of manufacturing the upper mesa structure 84 illustrated in FIG. 6, the n type InP spacer layer 46 is etched by using the dry etching in the same manner as the first embodiment. In this case, the n type InP cladding layer 44 of which the film thickness is relatively large maybe formed by using the wet etching using a hydrochloric acid-based solution, and the dry etching in combination. It is possible to form the lower mesa structure 13 by the same manufacturing method as that of the first embodiment. Thereafter, by using the known MOCVD method, the p type InP layer 91 of which the doping concentration is $4\times10^{17}$ cm$^{-3}$, and the thickness is 30 nm, the n type InP layer 92 of which the doping concentration is $1\times10^{18}$ cm$^{-3}$, and the thickness is 50 nm, and the Fe-doped InP layer 93 of which the doping concentration is $4\times10^{16}$ cm$^{-3}$, and the thickness is 320 nm are continuously buried. The thickness of the buried semiconductor layer 85 may be a thickness of approximately 400 nm so as to cover the side surface of the lower mesa structure 13 as illustrated in FIG. 6, or may be a thickness that increases up to the InGaAsP contact layer 45 or more in a preferential manner of flatness of the entire semiconductor laser and stress reduction of the upper mesa structure 84 as illustrated in FIG. 7.

In the optical semiconductor device 3 according to the third embodiment, the non-reflection coating of 0.1% or less is performed on the front end surface, and the high reflection coating of 90% is performed on the rear end surface. The resonator length is 110 μm, and the diffraction grating structure in which λ/4 shift is provided at a position of 35 μm from the rear end surface is made. In the optical semiconductor device 3 according to the third embodiment, the threshold currents at 25° C. and 85° C. are respectively 1.1 mA, and 2.8 mA, and low threshold currents are obtained. The characteristic temperature of the threshold current is 64 K which is the favorable value regardless of the small threshold current.

The slope efficiencies are 0.29 W/A at 25° C., and 0.21 W/A at 85° C., respectively, which are favorable. The slopes of the relaxation oscillation frequency $f_r$ relative to the square root of the driving current are 7.2 GHz/mA$^{1/2}$ at 25° C., and 6.8 GHz/mA$^{1/2}$ at 85° C., respectively, and good characteristics are obtained. The estimated lifetime at 85° C. is $2.8\times10^5$ hours, and it is possible to obtain high reliability.

Figure 8:
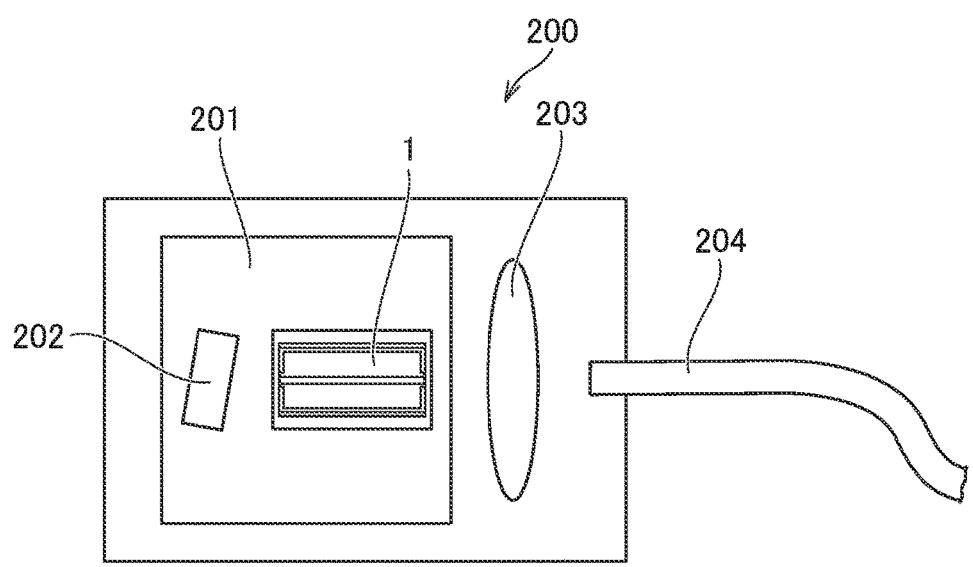
FIG. 8 is a diagram schematically illustrating an optical module on which the optical semiconductor device of FIG. 1 of the invention is mounted.

FIG. 8 is a diagram schematically illustrating an optical module on which the optical semiconductor device 1 is mounted. As illustrated in FIG. 8, a TOSA module 200 being the optical module includes the optical semiconductor device 1, a sub-mount 201 that is a ceramic substrate to which the optical semiconductor device 1 is bonded by using AuSn which is a metal bonding agent, a monitor photodiode 202 for an automatic power control (APC) control that is mounted along with the optical semiconductor device 1 on the sub-mount 201, a lens 203 that focuses the light emitted from the optical semiconductor device 1, and an optical fiber 204 that causes the light which is coupled by the lens 203 to be guided internally. In this manner, the TOSA module 200 using the optical semiconductor device 1 is excellent in frequency response characteristic, and is excellent in long-term reliability. The TOSA module of a type using a ferrule (fiber stub) without using the optical fiber 204, may be used.

The invention is not limited to the DFB laser, and may be applied to a Fabry-Perot laser. In the invention, a single semiconductor laser is described, but needless to say, it is possible to make an integrated type semiconductor laser that includes a passive waveguide in front of a semiconductor laser, or a modulator integrated type semiconductor laser in which an absorption type modulator of a waveguide type is integrated, in the same manner.

While there have been described what are at present considered to be certain embodiments of the invention, it will be understood that various modifications may be made thereto, and it is intended that the appended claims cover all such modifications as fall within the true spirit and scope of the invention.

What is claimed is:
1. An optical semiconductor device comprising:
an InP semiconductor substrate;
a lower mesa structure that is disposed above the InP semiconductor substrate, and includes a multiple quantum well layer;
an upper mesa structure that is disposed on the lower mesa structure, and includes a cladding layer;
a buried semiconductor layer that buries both side surfaces of the lower mesa structure; and
an insulating film that covers both side surfaces of the upper mesa structure by being in contact with both side surfaces of the upper mesa structure,
wherein the lower mesa structure includes a first semiconductor layer, above the multiple quantum well layer,
wherein the upper mesa structure includes a second semiconductor layer which is different from the cladding layer in composition and below the cladding layer,
wherein a refractive index of the second semiconductor layer is higher than the refractive index of the cladding layer, and
wherein the second semiconductor layer includes a diffraction grating layer and a separate confinement heterostructure layer.
2. The optical semiconductor device according to claim 1, wherein the second semiconductor layer further comprises an electron stop layer.
3. The optical semiconductor device according to claim 1, wherein the cladding layer is an InP layer, and
each of the diffraction grating layer and the separate confinement heterostructure layer is a layer of plural kinds of elements including phosphorus (P).
4. The optical semiconductor device according to claim 1, wherein the first semiconductor layer is a separate confinement heterostructure layer,
including plural kinds of elements including aluminum (Al).
5. The optical semiconductor device according to claim 1, wherein the multiple quantum well layer is a layer of plural kinds of elements including aluminum (Al).
6. An optical semiconductor device array, comprising:
a plurality of the optical semiconductor devices according to claim 1,
wherein the optical semiconductor devices are disposed on the InP semiconductor substrate side by side.
7. The optical semiconductor device array according to claim 6, further comprising:
an isolation groove that isolates the buried semiconductor layer located between the optical semiconductor devices which are adjacent to each other.
8. A method for manufacturing an optical semiconductor device, comprising:
stacking a lower semiconductor multi-layer and an upper semiconductor multi-layer on an InP semiconductor substrate, the lower semiconductor multi-layer including a multiple quantum well layer and a first semiconductor layer in sequence, and the upper semiconductor multi-layer including a second semiconductor layer, including a separate confinement heterostructure layer and a diffraction grating layer, and a cladding layer in sequence, the second semiconductor layer being different from the cladding layer in composition, wherein a refractive index of the second semiconductor layer is higher than the refractive index of the cladding layer;
forming an upper mesa structure by forming a first mask that extends a longitudinal direction of an optical waveguide of the optical semiconductor device on the upper semiconductor multi-layer, and removing one or more portions of the upper semiconductor multi-layer which lie outside of the first mask seen from above the optical semiconductor device;

forming a lower mesa structure by removing one or more portions of the lower semiconductor multi-layer which lie outside of a second mask that surrounds an upper surface and sides of the upper mesa structure seen from above the optical semiconductor device;

covering both sides of the lower mesa structure with a buried semiconductor layer; and covering both sides of the upper mesa structure and an upper surface of the buried semiconductor layer by being in contact with an insulating film.

9. An optical module comprising:

the optical semiconductor device according to claim 1; and a lens that focuses light emitted from the optical semiconductor device.

* * * * *